(12) United States Patent
Avery et al.

(10) Patent No.: US 8,522,569 B2
(45) Date of Patent: Sep. 3, 2013

(54) UTILIZATION OF DATA CENTER WASTE HEAT FOR HEAT DRIVEN ENGINE

(75) Inventors: Randal N. Avery, Bogart, GA (US); Charlie Booth, Watkinsville, GA (US); Wes Livingston, Athens, GA (US); Tom Watson Lopp, Bogart, GA (US)

(73) Assignee: Industrial Idea Partners, Inc., Athens, GA (US)

( * ) Notice: Subject to any disclaimer, the term of this patent is extended or adjusted under 35 U.S.C. 154(b) by 955 days.

(21) Appl. No.: 12/606,895

(22) Filed: Oct. 27, 2009

(65) Prior Publication Data
US 2011/0096503 A1  Apr. 28, 2011

(51) Int. Cl.
F25B 27/00 (2006.01)

(52) U.S. Cl.
USPC ........................................ 62/238.6

(58) Field of Classification Search
USPC .............. 62/238.6, 79, 324.1, 476; 165/80.4; 361/699, 701
See application file for complete search history.

(56) References Cited

U.S. PATENT DOCUMENTS

| | | | |
|---|---|---|---|
| 4,669,532 A | 6/1987 | Tejima | |
| 6,775,137 B2 | 8/2004 | Chu et al. | |
| 6,807,056 B2 | 10/2004 | Kondo et al. | |
| 6,847,014 B1 | 1/2005 | Benjamin | |
| 6,973,801 B1 | 12/2005 | Campbell et al. | |
| 7,104,312 B2 | 9/2006 | Goodson | |
| 7,115,987 B2 | 10/2006 | Holalkere et al. | |
| 7,289,326 B2 | 10/2007 | Heydari | |
| 7,342,789 B2 | 3/2008 | Hall et al. | |
| 7,367,359 B2 | 5/2008 | Maluf | |
| 7,402,048 B2 | 7/2008 | Meier et al. | |
| 7,420,804 B2 | 9/2008 | Leija et al. | |
| 7,420,808 B2 | 9/2008 | Campbell et al. | |
| 7,432,592 B2 | 10/2008 | Shi et al. | |
| 7,518,871 B2 | 4/2009 | Campbell et al. | |
| 7,548,424 B2 | 6/2009 | Altman et al. | |
| 7,548,425 B2 | 6/2009 | Hata et al. | |
| 7,639,499 B1 | 12/2009 | Campbell et al. | |
| 2004/0132398 A1 | 7/2004 | Sharp | |

(Continued)

FOREIGN PATENT DOCUMENTS

| | | |
|---|---|---|
| WO | WO/2006/039611 | 4/2006 |
| WO | WO/2006/073553 | 7/2006 |
| WO | WO/2007/096313 | 8/2007 |
| WO | WO/2008/025462 | 3/2008 |

OTHER PUBLICATIONS

Stephen A. Solovitz, Ljubisa D. Stevanovic, Microchannels Take Heatsinks to the Next Level, Power Electronics Technology, Nov. 1, 2006.

(Continued)

Primary Examiner — Melvin Jones
(74) Attorney, Agent, or Firm — Miller & Martin PLLC

(57) ABSTRACT

A method and system of utilizing waste heat from a plurality of data center equipment comprising the steps of collecting waste heat from a plurality of data center equipment and utilizing said waste heat as the driving heat input for a heat driven engine. Heat recovery means collects waste heat from heat-producing equipment and transfers it in the form of hot water to drive a heat driven engine such as a chiller or heat pump. The output of the heat driven engine may be put to many productive uses, thereby reducing the over all energy load on the data center.

18 Claims, 4 Drawing Sheets

(56) References Cited

U.S. PATENT DOCUMENTS

| | | | |
|---|---|---|---|
| 2004/0264124 | A1 | 12/2004 | Patel |
| 2006/0108098 | A1 | 5/2006 | Stevanovic |
| 2006/0231238 | A1 | 10/2006 | Ball, Jr. |
| 2007/0002536 | A1 | 1/2007 | Hall |
| 2007/0025078 | A1 | 2/2007 | Silverstein |
| 2007/0074525 | A1 | 4/2007 | Vinson |
| 2007/0213881 | A1 | 9/2007 | Belady |
| 2008/0013283 | A1 | 1/2008 | Gilbert |
| 2008/0026509 | A1 | 1/2008 | Campbell |
| 2008/0055851 | A1 | 3/2008 | Hall |
| 2008/0062647 | A1 | 3/2008 | Hills |
| 2008/0225485 | A1 | 9/2008 | Altman et al. |
| 2008/0237854 | A1 | 10/2008 | Wu et al. |
| 2008/0245506 | A1 | 10/2008 | Campbell |
| 2008/0259566 | A1 | 10/2008 | Fried |
| 2008/0273307 | A1 | 11/2008 | Campbell |
| 2009/0097205 | A1* | 4/2009 | Matsushima et al. ......... 361/700 |
| 2009/0218078 | A1 | 9/2009 | Brunschwiler |
| 2009/0260777 | A1 | 10/2009 | Attlesey |
| 2009/0262495 | A1 | 10/2009 | Neudorfer |
| 2009/0283244 | A1 | 11/2009 | Bezama |
| 2010/0073863 | A1 | 3/2010 | Matsushima et al. |

OTHER PUBLICATIONS

Sarit K. Das, Stephen U. S. Choi, Wenhua Yu, and T. Pradeep, Nanofluids: Science and Technology, © 2008 John Wiley & Sons, Inc.

Christian L. Belady, P.E., In the data center, power and cooling costs more than the equipment it supports, Electronic Cooling Magazine, Feb. 2007, vol. 13, No. 1.

Scott D. Garner, PE, Heat pipes for electronics cooling applications, Thermacore Inc., Electronic Cooling Magazine, Sep. 1996, vol. 2, No. 3.

Kaveh Azar, PHD, The history of power dissipation, Electronic Cooling Magazine, Jan. 2000, vol. 6, No. 1.

Roger Schmidt, Low temperature electronic cooling, Electronic Cooling Magazine, Sep. 2000, vol. 6, No. 3.

John W. Peeples, Vapor Compression Cooling for High Performance Applications, Electronic Cooling Magazine, Aug. 2001, vol. 7, No. 3.

Sameer Khandekar, Manfred Groll and Vivak Luckchoura, An Introduction to Pulsating Heat Pipes, Electronic Cooling Magazine, May 2003, vol. 9, No. 2.

Kaveh Azar, Cooling Technology Options, Part 1 and 2, Electronic Cooling Magazine, Aug. 2003, vol. 9, No. 3 and Nov. 2003, vol. 9, No. 4.

Michael J. Ellsworth, Jr. and Robert E. Simons, High Powered Chip Cooling—Air and Beyond, Electronic Cooling Magazine, Aug. 2005, vol. 11, No. 3.

Phil E. Tuma and Hamid R. Mortazavi, Indirect Thermosyphons for Cooling Electronic Devices, Electronic Cooling Magazine, Feb. 2006, vol. 12, No. 1.

Steven R. Laplante, Norman Aubry, Louis Rosa, Patrick Levesque, B. (Sam) Aboumrad, Don Porter, Chuck Cavanaugh, Jamie Johnston, Liquid Cooling of a High-Density Computer Clust.

K.J. Kelly, T. Abraham, K. Bennion, D. Bharathan, S. Narumanchi, and M. O'Keefe, Assessment of Thermal Control Technologies for Cooling Electric Vehicle Power Electronics, NRE.

New Technology Has Dramatic Chip-cooling Potential for Future Computers, ScienceDaily, Purdue University (Aug. 14, 2007).

American Society of Heating Refrigeration and Air-Conditioning Engineers, Inc., 2008 ASHRAE Environmental Guidelines for Datacom Equipment.

Paul Eng, Cooling Down Hot Computer Chips, ABC News, Dec. 16, 2008.

\* cited by examiner

UTILIZATION OF DATA CENTER WASTE HEAT FOR HEAT DRIVEN ENGINE

BACKGROUND OF THE INVENTION

This invention relates generally to increasing the efficiently of energy utilization of data centers. Specifically, this invention relates to a method of utilizing the waste heat generated by data centers to increase the overall energy efficiency of the facility of which the data center is a part. This is accomplished by using such waste heat to drive a heat driven engine, such as a heat driven chiller or heat pump.

A heat driven chiller or heat pump may be understood as a "three temperature machine." Driving heat is input at high temperature, heat is rejected at a medium temperature and heat is adsorbed at a low temperature. In a chiller, the heat adsorbed at the low temperature provides the useful cooling. For purposes of this disclosure, the term "heat pump" will be used to refer to a heat driven engine that provides rejected heat as the useful product.

A data center, sometimes called a server farm, is a facility used to house computer systems and associated components, such as telecommunications and storage systems. It may be an entire building, a single room, or one or more floors or other separate portions of a building. In addition to computer systems and associated components, data centers typically house one or more redundant backup power supplies, redundant data communications connections, environmental controls (e.g., air conditioning systems, fire suppression systems) and security devices.

Adequate environmental controls are a priority for data centers because such systems must continually provide environmental conditions suitable for the computer and server equipment used to store and manipulate a business' electronic data and information systems. For example, the American Society of Heating, Refrigerating and Air-Conditioning Engineers, Inc., in its "2008 AHSRAE Environmental Guidelines for Datacom Equipment," recommends an environmental temperature range of 20-25° C. (68-75° F.) and a relative humidity range of 40-55%. [These stats are correct as per latest guidelines, is there anything later than the report cited here?].

As the amount of equipment in a data center increases, and as the number computations or operations per component increase and the speed of individual components increase, the computer and other electronic components will generate increasing amounts of waste heat. Growth in the size, complexity and sophistication of data centers and the components housed therein have required correspondingly larger and more powerful air cooling and dehumidification systems to keep the data center and the equipment it houses sufficiently cool. Keeping an area and the devices within it cool can also be conceptualized as rejecting the heat generated by the equipment within the area out of the area, in this case, taking heat out of the data center.

There are over 60,000 data centers in the U.S. and Canada. Data centers consume approximately 1.7% of the U.S.'s electricity (costing about U.S. $5B per year). Large data centers can consume up to 30-40 MW in energy each year, 10 MW or more of which goes to cooling. U.S. data centers consumed 66 million MW-Hrs of electricity in 2007, and this number is growing at 12% per year (doubling every 5 years), with at least one third of this going to cooling. The present invention provides a novel method of reducing the energy demands of this cooling load and putting heat energy previously rejected as waste to use.

BRIEF SUMMARY OF THE INVENTION

This invention relates to a method and means of using a portion or all of the waste heat that is currently rejected as waste from data centers as the heat input to a heat driven engine, such as a heat driven chiller or heat pump. Specifically, the heat generated by the plurality of computer systems and associated components, boards, electronics, telecommunications equipment, data storage systems, racks, cabinets and other related equipment typically found in data centers is captured and utilized as the heat input for a heat driven engine. In one preferred embodiment, the method has been found compatible with driving an adsorption chiller consisting of a sorbate-sorbent working pair, preferably a silica gel-water working pair adsorption chiller.

Currently, the heat output of a data center is generally considered only as waste heat which must be eliminated, typically by exhausting it directly to the atmosphere. The present invention extracts useful work or output from this waste heat. The useful output of the heat engine chiller (cold water) or heat pump (rejected heat) can be used for a variety of useful purposes such as the de-humidification and air conditioning required to cool the equipment within the data center.

The removal of heat from equipment in a data center may be accomplished through the use of liquid heat exchangers mounted on critical heat producing components of the equipment within a data center, such as CPU, drives, video cards, etc. (the details of this heat exchanger mechanism is not proposed herein). Alternatively, spray-direct contact devices are also being developed to apply directly to critical heat producing data center components to remove heat by means of a fluid.

Advanced liquid heat exchanger technologies currently in development are expected to produce from the plurality of data center components an output fluid having a temperature in the range of about 140° F. to about 170° F. Output fluids having a temperature in this range are well suited for use as the heat input for a heat driven engine, and especially for a silica gel-water working pair adsorption chiller.

In the method of the present invention, a heat driven engine, such as an adsorption chiller, may be driven by using the waste heat from the data center as the sole source of the driving heat input. Stated with more specificity, it is the waste heat of the plurality of components, boards, rack/cabinet, equipment, etc. within the data center that may be used to heat a working fluid which is then used to drive the chiller, either directly or indirectly. Alternatively, the waste heat from the equipment in a data center may be combined with other sources of heat to drive a heat driven chiller or heat pump, thereby reducing the overall load on the alternate heat sources and improving the efficiency of the facility's systems. For example, waste heat from a data center may be used to augment the heat from solar panels, fuel cell exhaust, combined cycle plants consisting of one or more diesel engines or gas turbines or steam turbines, or from other boiler processes fired by fuel choices such as coal, oil, natural gas or nuclear power, or it may be combined with the waste heat of other processes.

It is anticipated that the waste heat generated by typical data centers, alone or augmented, can provide adequate heat energy to the chiller such that the chiller could produce sufficient cold water output to satisfy other cooling needs of the facility, such as auxiliary equipment cooling or industrial process cooling.

It is therefore a purpose of the present invention to provide a method of utilizing the low quality heat currently rejected from data center equipment to derive meaningful work by using it as the input to drive a heat driven engine, such as a chiller or heat pump. No other device, method, process or application has been identified where such low quality waste heat can be utilized as a meaningful work input to drive a heat driven chiller or heat pump.

BRIEF DESCRIPTION OF THE DRAWINGS

The particular features and advantages of the invention as well as other objects will become apparent from the following description taken in connection with the accompanying drawings in which.

DETAILED DESCRIPTION OF THE INVENTION

Data centers and the multiplicity of types of data center equipment located therein are well known in the art. It is also well known that data center equipment generates a significant amount of heat that must be controlled by various means to maintain the data center equipment in working order. While it is not practical to include an exhaustive list of the function and type of every potential type of equipment that might be found in a data center of a business or other organization, for purposes of this disclosure, the term "data center equipment" will be used to refer to any type of heat generating component that one may find useful to locate within a protected environment of an organization's data center or other facility for the collection and installation of computer systems, electronics or controls. Such data center equipment typically comprises, but is not limited to, computer systems, electronics, data storage systems, communications equipment, networking equipment, information technology equipment and components and parts therefor, such as, but not limited to, servers, chips, processors, motherboards, sound cards, graphics cards, memory devices, data storage devices, modems, and any other equipment or component that now or may in the future be found useful in the field.

Figure 1:
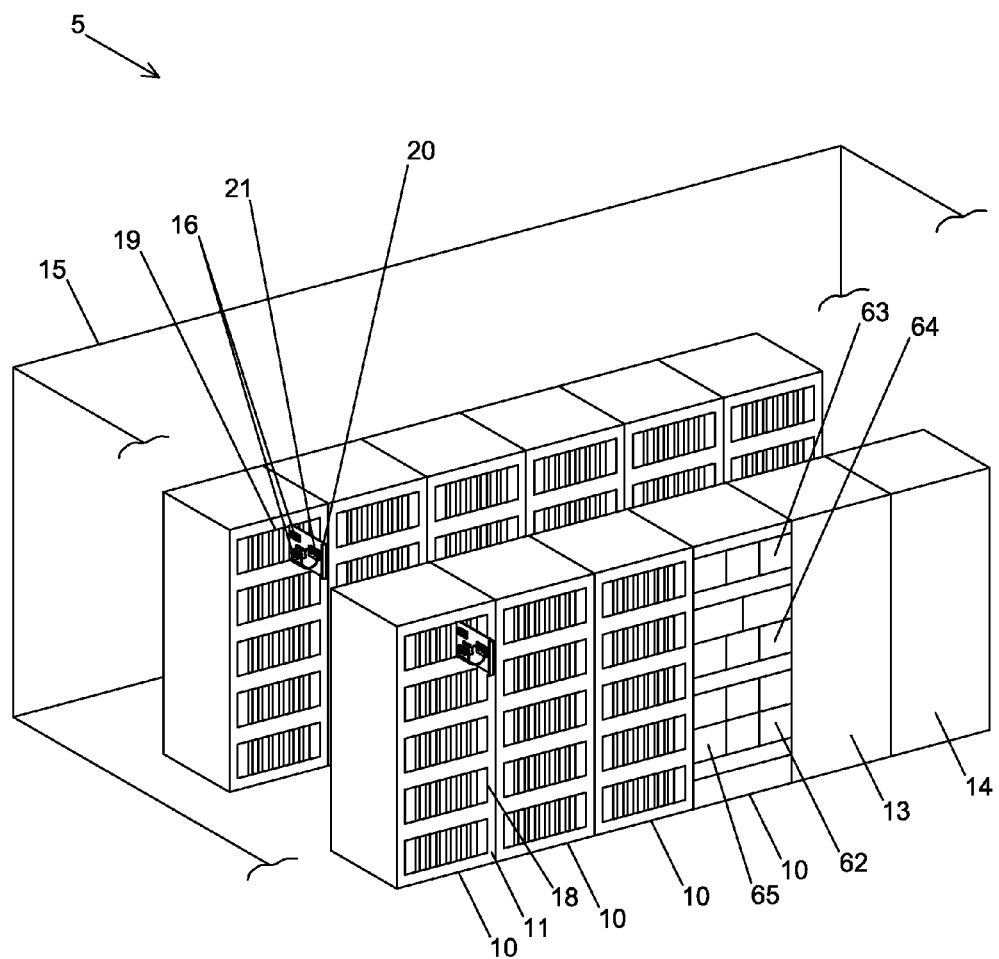
FIG. 1 is a perspective view illustrating a typical data center and data center equipment.

FIG. 1 illustrates a view of a typical data center 5 comprising a plurality of rack style cabinets 10 arranged in single rows forming corridors between them for ease of access. Cabinets 10 house a plurality of numerous types of data center equipment 11 such as servers 20, boards 21, storage devices such as hard drives 18, tape drives 63, computer power supplies 65 and other related equipment typically found in data centers. Some larger data center equipment 11, such as mainframe computers 13 and some storage devices 14 are often as big as the racks 10 themselves, and are placed along side them.

Data centers 5 are normally located in a separate building 15 or portion thereof equipped with redundant or backup power supplies, redundant data communications connections, environmental controls, such one or more cooling systems and fire suppression systems, and security devices (not shown). The cooling system typically used would consist of one or more normal industrial air conditioning systems, usually with redundancy.

Each of the cabinets 10 can house a plurality of disk drives 18 and computers 19, such as, but not limited to, the common "blade style" servers 20. The cabinets 10 may also contain communications equipment 62, tape drives 63 and networking equipment 64. A single server blade 20, when extracted from the rack 10 by pulling it forward, reveals one or more boards 21 holding one or more integrated circuit chip components 16. Many of these chip components 16 produce large amounts of heat that must be extracted from the cabinet 10 to prevent overheating of the data center equipment 11. This discussion presents a new method of utilizing the heat generated by such data center equipment 11, thereby increasing the efficiency of energy utilization of the data center 5 and the facility or building 15 in which it is located.

Figure 2:
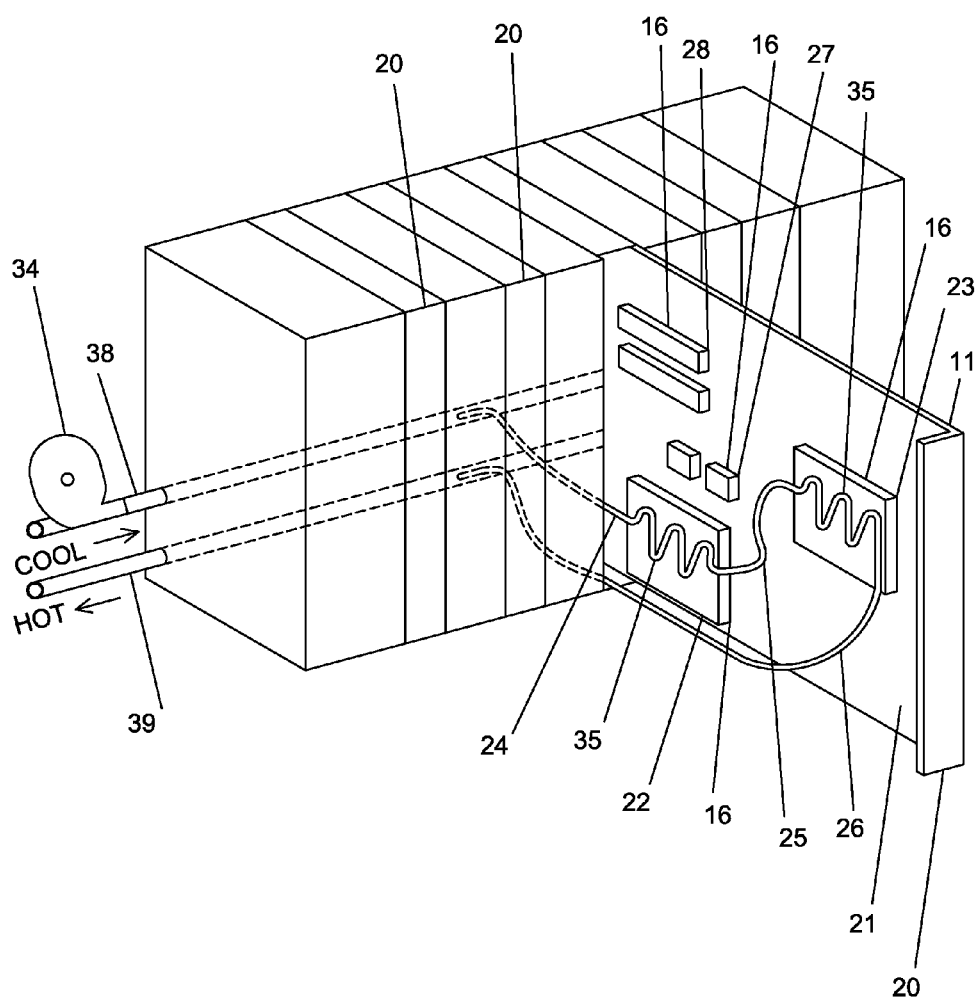
FIG. 2 is perspective view of a data center rack illustrating an alternative heat recovery means for capturing waste heat from data center equipment for use in the method of the present invention.

FIG. 2 illustrates one alternative heat recovery means for collecting waste heat from the data center equipment 11 of a data center 5. One of a plurality of servers 20 is shown extracted or pulled out of the rack 10 revealing one or more boards 21 holding one or more integrated circuit chip components 16. As is known in the industry, certain of these chip components 16, such as central processing unit (CPU) 22, video chips 23, or memory (not shown) produce comparatively greater amounts of heat than do less heat-producing chips 16 such as input or output controllers 27 or individual electrical components 28, such as capacitors or resistors. All of these integrated circuit chip components 16, would normally be cooled by applying an air-based heat exchanger (i.e., air conditioning (not shown). Often, a separate fan (not shown) is also used to circulate cool air forcefully and rapidly across the hottest chip components 16 among the heat-producing data center equipment 11.

The present invention provides a method of utilizing the output of a fluid-based heat exchanger 35 operatively mounted on a plurality of the higher heat-producing chips 22, 23 of data center equipment 11 to provide the hot water input to drive a heat driven engine (not shown in FIG. 2).

As shown in FIG. 2, on each server 20, a fluid-based heat exchanger 35 is affixed to each of one or more of the higher heat producing chips 22, 23. In practice, a single fluid-based heat exchanger 35 would be operatively mounted upon or be associated with or correspond to each chip 22, 23 from which the waste heat will be collected. A plurality of fluid-carrying tubing sections 24, 25, 26 are provided for circulating fluid, such as water or any other suitable refrigerant or coolant fluid, from an inlet line 38 to one or more fluid-based heat exchangers 35 and back to an outlet line 39. Many alternate arrangements of circulation systems comprising interconnecting tubing sections 24, 25, 26 and one or more fluid-based heat exchangers 35 are within the contemplation of the present invention. The specific circulation system configuration depends upon the different types of data center equipment 11 being cooled and the number of fluid-based heat exchangers 35 affixed to the different components 16 of each piece of data center equipment 11. It is also recognized that the fluid-based heat exchanger 35 may be permanently mounted onto the chip 16, or it may be detachably mounted. Having detachable fluid-based heat exchangers 35 would allow the associated circuit board 21 or the corresponding heat producing chip 22 or 23 to be replaced without replacing or disconnecting the fluid-based heat exchanger 35.

Inlet line 38 supplies cooling fluid to the fluid-based heat exchangers 35. Cooling fluid directed into the data center equipment 11 circulation system may be of any suitable temperature capable of receiving heat from data center equipment 11. When practiced in connection with a heat driven chiller (not shown), cooling fluid supplied through inlet line 38 has a temperature in the range of about 120° F. to about 170° F., preferably in the range of about 130° F. to about 150° F. After passing or being circulated through one or more fluid-based heat exchangers 35 on data center equipment 11, the temperature of the refrigerant fluid would be raised by the fluid-based heat exchangers 35 to a temperature in the range of about 125° F. to about 180° F., preferably in the range of about 150° F. to about 170° F.

Figure 3:
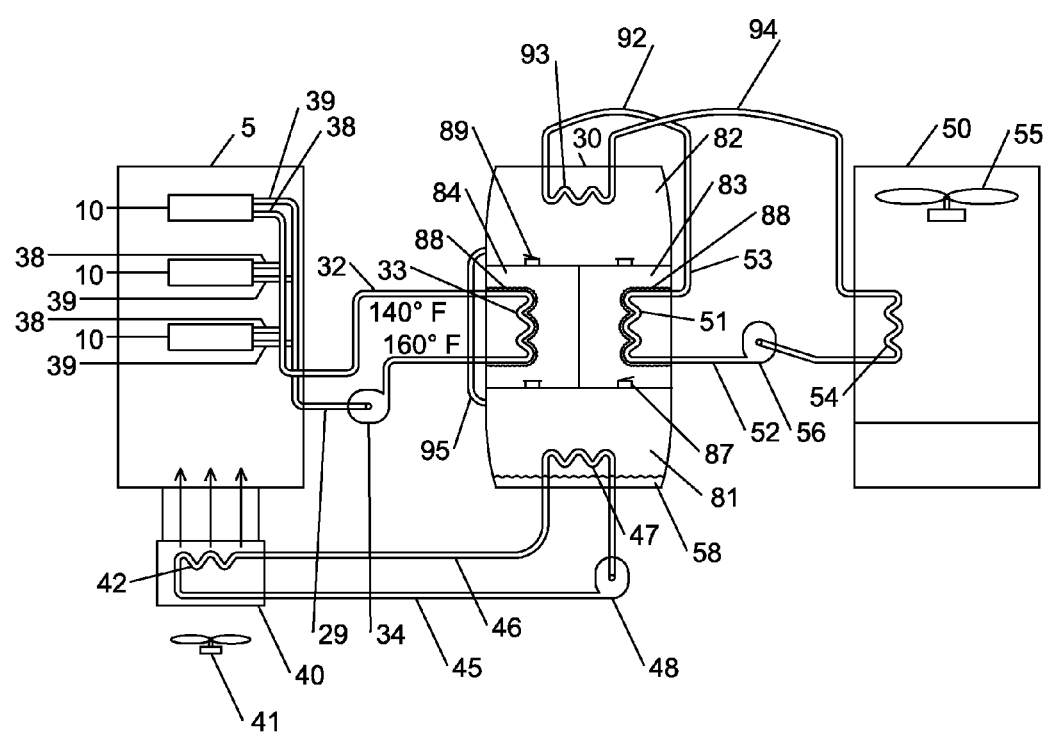
FIG. 3 is a schematic representation of one embodiment of a heat driven chiller through which the method of the present invention may be practiced.

Refrigerant fluid thus heated would be circulated to the outlet line 39 where it is passed out of the data center equipment 11 circulation system for use as the driving heat input into the heat engine, which, as shown in FIG. 3, may comprise an adsorption chiller 30. The specific temperature of fluid exiting the data center equipment 11 circulation system can be regulated by using a pumping means 34 to adjust the flow rate of fluid across the fluid-based heat exchangers 35.

Other, less heat-producing computer chips 27, 28 on the same server 20 that do not generate sufficient heat to warrant individual heat exchangers 35 will continue to be cooled by general air flow through the racks and cabinets of the data center 5.

As shown in FIG. 3, a data center equipment 11 circulation system would typically comprise one or more inlet lines 38 and outlet lines 39 associated with each cabinet 10 or other piece of data center equipment 11 housed within the data center 5. Appropriate plumbing connects all of the inlet lines 38 within a data center 5 to one or more return lines 32 operatively connected to a heat driven engine, such as chiller 30. Appropriate plumbing connects all of the outlet lines 39 within a data center 5 to one or more chiller feeder lines 29 operatively connected to a heat driven engine, such as chiller 30.

FIG. 3 is a drawing of one embodiment of one type of heat engine, a heat driven chiller 30, through which the method of the present invention may be practiced. Heat recovered by suitable heat recovery means from a data center 5 is utilized to power a heat driven chiller 30, preferably a silica gel-water adsorption chiller. Adsorption chillers are well known in the art. A typical adsorption chiller 30 comprises four chambers: an evaporator 81, a condenser 82, and two adsorption chambers 83, 84. All four chambers are operated at nearly a full vacuum. The adsorption chiller 30 cycles the adsorption chambers 83, 84 between adsorbing and desorbing cycles. In FIG. 3, adsorption chamber 83 is shown in the adsorption cycle and adsorption chamber 84 is shown in the desorption cycle.

The full vacuum of the evaporator 81 causes water 58 to boil and flash off of the surfaces of the evaporator 81 into water vapor. This creates a chilling effect in the evaporator heat exchanger 47 that chills the fluid, typically water, entering the evaporator 81 through a cold water return line 46, to the evaporator heat exchanger 47. In the evaporator heat exchanger 47, the fluid is chilled by the evaporative process occurring in the evaporator 81, producing cold water which is output from the evaporator heat exchanger 47 into the cold water output line 45.

The water vapor enters adsorption chamber 83 from the evaporator 81 through one or more open valves 87 communicating between evaporator 81 and adsorption chamber 83, and is adsorbed into the sorbent 88, such as silica gel, in the adsorption chamber 83. In the adsorption cycle, chilling water is circulated into adsorption chamber 83 through a chilling water return line 52 connected to an internal heat exchanger 51. The internal heat exchanger 51 removes the heat that was deposited in this chamber 83 by the adsorption process. The internal heat exchanger 51 warms up the chilling water, which then exits the chamber 83 through a chilling water output line 53 connected to internal heat exchanger 51.

Contemporaneously, during the desorption cycle depicted in adsorption chamber 84, water vapor previously adsorbed into the sorbent 88 is driven from the sorbent 88 by hot fluid, typically water, generated using heat recovery means from the data center 5. Hot water, at least partially generated by heat recovery means from the data center 5 and the data center equipment 11 therein, enters adsorption chamber 84 through chiller feeder line 29 which is connected to internal heat exchanger 33. Heat from the hot water in the internal heat exchanger 33 raises the temperature of the sorbent 88, thereby driving water vapor previously adsorbed in the sorbent 88 back into water vapor. Running hot water through internal heat exchanger 33 cools the hot water which, having lost heat, flows out of the internal heat exchanger 33 through a connected return line 32 that passes out of the adsorption chamber 84. In practice it may be desirable to use one or more fluid-to-fluid heat exchangers (not shown) on the chiller feeder line 29 and return line intermediate the data center equipment circulation system if the fluids used to recover heat from the data center equipment circulation system and the driving fluid of the heat driven engine cannot be intermixed or must be kept separate for some reason, or if some temperature regulation between the two fluids is necessary based upon operating parameters.

Desorbed water vapor passes through one or more valves 89 communicating between the adsorption chamber 84 and the condenser 82 into the condenser 82, where it is condensed by chilling water running through a condenser inlet line 92 to a condenser heat exchanger 93 to a condenser output line 94. The condensed water is recycled to the evaporator 81 through a drain 95, where it is immediately available for reuse. Appropriate plumbing is typically employed to operatively connect the chilling water output line 53 to condenser inlet line 92 for each adsorption chamber 83, 84 when it is in the adsorption cycle. Condenser output line 94 is also plumbed appropriately to feed chilling water to the heat sink 50.

During this adsorption cycle, the water vapor pressure in adsorption chamber 83 is slightly lower than in the evaporator 81. A portion of the refrigerant, normal water, evaporates and is pulled or flows along the vapor pressure gradient to adsorption chamber 83. At the same time, the vapor pressure in adsorption chamber 84 is slightly elevated as the water vapor is driven from the silica gel. Water vapor in adsorption chamber 84 is pulled into the condenser 82 which has a relatively lower vapor pressure due to the condensation taking place.

When the silica gel in adsorption chamber 83 is substantially saturated with water and the silica gel in adsorption chamber 84 is substantially dry, the chiller 30 automatically reverses, shifting adsorption chamber 83 into the desorption cycle and adsorption chamber 84 into the adsorption cycle. The first step of this switch is to open all the valves 87, 89, 90, 91 between the various chambers 81, 82, 83, 84 of the chiller 30, thereby allowing the vapor pressure to equalize. Then the flows of cool water and hot water (or driving fluid) through the adsorption chambers 83, 84 are switched in order to begin the adsorption and desorption cycles in those chambers 83, 84.

The adsorption chiller 30 process is capable of operating with a wide range of temperatures for the hot, the chilling, and the cold water. It easily regulates itself and balances the performance using multiple control programs, shifting to the program best suited for the present conditions. For the best performance of a typical adsorption chiller 30, the hot water has a temperature in the range of about 125° F. to about 195°

F., the chilling water has a temperature in the range of about 50° F. to about 100° F. preferably in the range of about 70° F. to about 85° F. and the output cold water has a temperature in the range of about 35° F. to about 50° F., preferably in the range of about 38° F. to 40° F.

Adsorption chillers 30 may also utilize other substances as the working pair, such as water and zeolite, ammonia and water, hydrogen and certain metal hydrides, activated carbon and a number of fluids. While each type of working pair could theoretically be used, the silica gel-water working pair has been found to be preferable for the present invention based upon its range of working temperatures and the simplicity of its chemistry.

Hot water powering or driving a heat driven chiller of the silica gel-water type could range from 125° F. to 195° F. and still be useful. However, it is expected that heat recovery means capturing heat from data center equipment 11 will produce hot water having a temperature in the range of about 125° F. to about 180° F., preferably about 160° F. The hot water generated from the data center 5 and the data center equipment 11 therein is extracted through an chiller feeder line 29 by a circulator pump 34. This hot water is used to drive the heat exchangers 33 or 51 of the adsorption chambers 83 or 84 in the desorption cycle. The hot water is returned to the data center 5, cooled to a temperature in the range of about 120° F. to about 170° F., preferably in the range of about 130° F. to about 150° F. through a return line 32.

The output of a heat driven chiller 30 is cold water that typically has a temperature of between about 35° F. to about 50° F. This cold water is produced in the cold water heat exchanger 47 of the evaporator 81 of the chiller 30. The cold water is circulated by a circulator pump 48 through a cold water output line 45. The cold water derived from a chiller 30 may be put to many different useful purposes as desired, but in one embodiment illustrated in FIG. 3, the cold water is circulated to a water-to-air heat exchanger 42 for cooling the data center 5. The heat exchanger 42 is located in a plenum chamber 40 that allows air to be circulated by a circulation fan 41 through the data center 5 to cool the data center 5 and the data center equipment 11. After passing through the water-to-air heat exchanger 42, the temperature of the cold water is typically increased about 8° F. to about 15° F. from the temperature at which it entered, and is returned to the chiller 30 by a cold water return 46.

The chilled water produced from the chiller 30 may also be used for other well known out-of-process or auxiliary applications within the data center 5 or facility within the data center 5 is located. Beyond the data center 5 itself, the chilled water can be put to a wide variety of other uses including air conditioning, process cooling for industrial or food preparation processes or machine cooling.

The heat that drives the chiller 30 and the heat extracted from the cold water are both ultimately rejected to a suitable heat sink. As shown in FIG. 3, the heat sink is represented as a water tower 50 where the heat is rejected to the air flow created by a circulator fan 55. The heat sink may comprise any number of well known heat sink devices such as an evaporative water tower, a dry water tower, a body of water or any other well known industrial process. As shown, the heat is dissipated from a water-to-air heat exchanger 54 containing the flow of chilling water from the chiller 30. This flow might be at a temperature as high as 100° F., arriving from the chiller 30 by way of the condenser output line 94. Once cooled in the heat sink, the chilling water is returned to the chiller 30 by way of the chilled water return line 52, forced along by a circulator pump 56.

Figure 4:
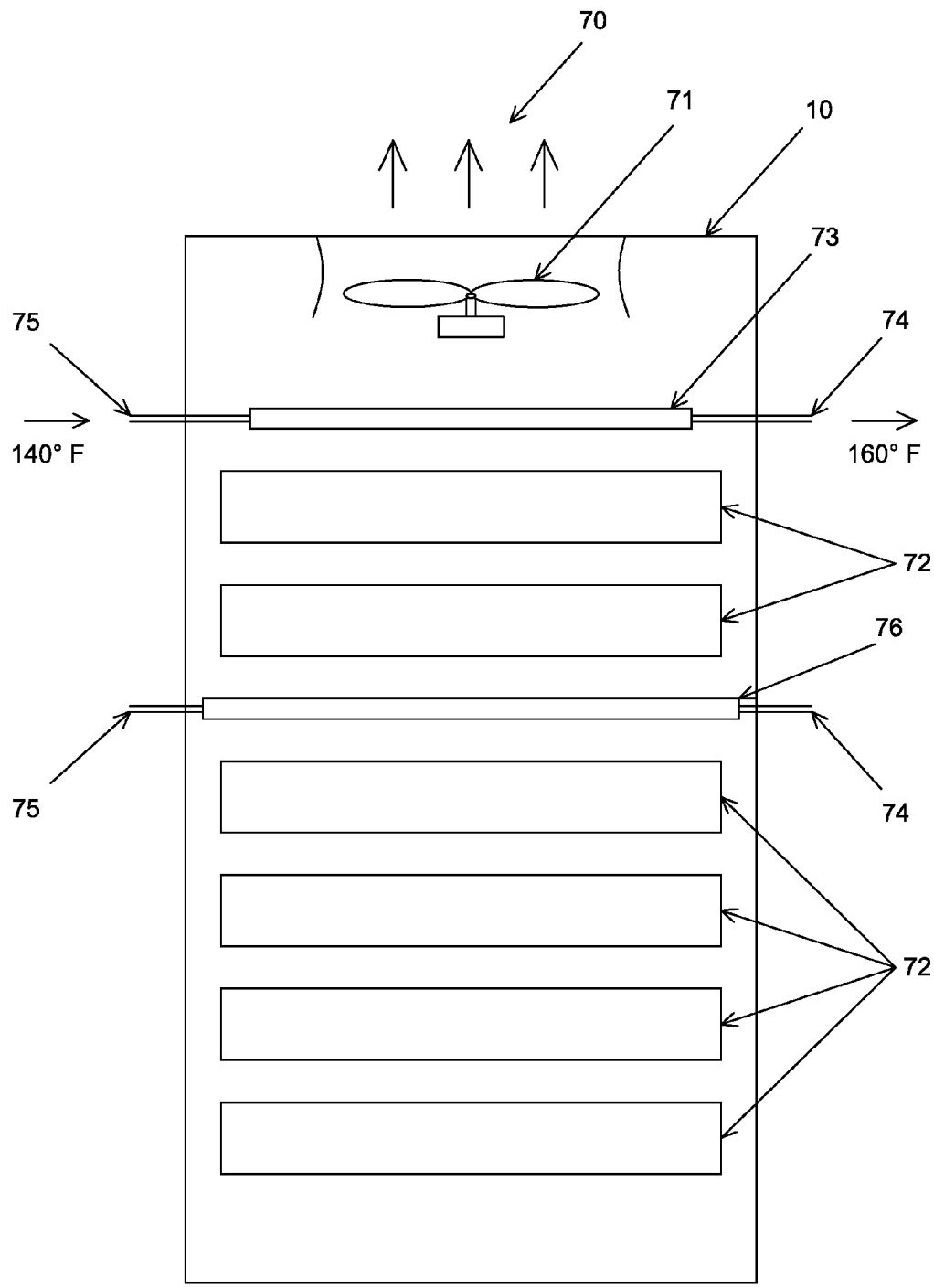
FIG. 4 is a front view of a data center rack illustrating an alternative heat recovery means for capturing waste heat from data center equipment for use in the method of the present invention.

FIG. 4 illustrates another alternative heat recovery means and method of capturing heat from data center equipment 11. Alternative heat recovery means, such as one or more air-to-fluid heat exchanger, preferably an air-to-water heat exchanger 73, is configured to be affixed to, adjoin or be housed within a rack style computer cabinet 10 housing multiple computer or server boards 72. An air flow 70 is pulled through the cabinet 10 and around the data center equipment 11 by one or more circulation fans 71, drawing the heated air from around the data center equipment 11, such as the servers boards 72 in the cabinet 10. The air flow 70 is directed about the air-to-water heat exchanger 73 to capture the heat being generated by the data center equipment 11. Incoming heat transfer fluid, such as water, enters the air-to-water heat exchanger 73 through an input tube 75 at a temperature not greater than about 140° F. The incoming water flows through the heat exchanger 73 and extracts heat from the air flow 70. The rate of water flow through the heat exchanger 73 may be adjusted to produce output water having a temperature in the range of about 125° F. to about 180° F., preferably in the range of about 150° F. to about 170° F. The output water is returned to drive the heat driven engine (not shown) through an output tube 74.

If desired, a cabinet 10 may be fitted with one or more air-to-fluid heat exchangers, such as air-to-water heat exchanger 76.

Although this invention has been disclosed and described in its preferred forms with a certain degree of particularity, it is understood that the present disclosure of the preferred forms is only by way of example and that numerous changes in the details of operation and in the combination and arrangement of parts may be resorted to without departing from the spirit and scope of the invention as hereinafter claimed.

We claim:

1. A method of utilizing waste heat generated by a plurality of data center equipment, which comprises the steps of:
    (a) collecting waste heat from said plurality of data center equipment, and
    (b) utilizing said waste heat as the driving heat input for a silica gel-water working pair adsorption chiller.

2. A method of utilizing waste heat generated by a plurality of data center equipment, which comprises the steps of:
    (a) collecting waste heat from said plurality of data center equipment, and
    (b) utilizing said waste heat as the driving heat input for a heat pump.

3. A method of utilizing waste heat generated by a plurality of heat-producing circuit chips, which comprises the steps of:
    (a) collecting waste heat from said plurality of heat-producing circuit chips, and
    (b) utilizing said waste heat as the driving heat input for a heat driven engine.

4. A method of utilizing waste heat generated by a plurality of data center equipment, which comprises the steps of:
    (a) collecting waste heat from said plurality of data center equipment through heat recovery means operatively mounted upon said plurality of data center equipment, and
    (b) utilizing said waste heat as the driving heat input for a heat driven engine.

5. The method of claim 4 wherein said heat recovery means further comprises a plurality of fluid-based heat exchangers, each of said fluid-based heat exchangers associated with one of said plurality of data center equipment.

6. The method of claim 5 wherein said data center equipment comprises heat-producing circuit chips and one of said fluid-based heat exchangers is operatively mounted upon a corresponding heat-producing circuit chip.

7. The method of claim 4 wherein said data center equipment comprises heat-producing circuit chips.

8. A method of utilizing waste heat generated by a plurality of data center equipment, said data center equipment comprising one or more cabinets, which method comprises the steps of:
   (a) collecting waste heat from said plurality of data center equipment through heat recovery means affixed to one or more cabinets, and
   (b) utilizing said waste heat as the driving heat input for a heat driven engine.

9. The method of claim 8 wherein said heat recovery means comprises an air-to-fluid heat exchanger.

10. A method of utilizing waste heat generated by a plurality of data center equipment, which comprises the steps of:
    (a) collecting waste heat from said plurality of data center equipment;
    (b) utilizing said waste heat as the driving heat input for a heat driven engine; and
    (c) cooling said data center equipment using an output of said heat driven engine.

11. A method of utilizing waste heat generated by a plurality of data center equipment, which comprises the steps of:
    (a) collecting waste heat from said plurality of data center equipment;
    (b) generating hot fluid from said collected waste heat;
    (c) utilizing said waste heat as the driving heat input for a heat driven engine by running said hot fluid through an adsorption chamber of an adsorption chiller.

12. A system for utilizing waste heat from a plurality of data center equipment comprising:
    (a) a heat recovery means for heating a fluid with waste heat from said plurality of data center equipment;
    (b) a silica gel-water working pair adsorption chiller; and
    (c) a circulation system for circulating said fluid between said heat recovery means and said silica gel-water working pair adsorption chiller.

13. A system for utilizing waste heat from a plurality of data center equipment comprising:
    (a) a heat recovery means for heating a fluid with waste heat from said plurality of data center equipment;
    (b) a heat pump; and
    (c) a circulation system for circulating said fluid between said heat recovery means and said heat pump.

14. A system for utilizing waste heat from a plurality of heat-producing circuit chips, said system comprising:
    (a) a heat recovery means for heating a fluid with waste heat from said plurality of heat-producing circuit chips;
    (b) a heat driven engine; and
    (c) a circulation system for circulating said fluid between said heat recovery means and said heat driven engine.

15. A system for utilizing waste heat from a plurality of data center equipment comprising:
    (a) a heat recovery means for heating a fluid with waste heat from said plurality of data center equipment, said heat recovery means comprising a plurality of fluid-based heat exchangers, each fluid-based heat exchanger associated with a corresponding data center equipment;
    (b) a heat driven engine; and
    (c) a circulation system for circulating said fluid between said heat recovery means and said heat driven engine.

16. The system of claim 15 wherein said data center equipment comprises heat-producing circuit chips.

17. A system for utilizing waste heat from a plurality of data center equipment, said data center equipment comprising one or more cabinets, said system comprising:
    (a) a heat recovery means for heating a fluid with waste heat from said plurality of data center equipment, said heat recovery means comprising an air-to-water heat exchanger affixed to one or more of said cabinets;
    (b) a heat driven engine; and
    (c) a circulation system for circulating said fluid between said heat recovery means and said heat driven engine.

18. A system for utilizing waste heat from a plurality of data center equipment comprising:
    (a) a heat recovery means for heating a fluid with waste heat from said plurality of data center equipment;
    (b) a heat driven engine;
    (c) a circulation system for circulating said fluid between said heat recovery means and said heat driven engine;
    (d) said heat driven engine producing an output of cold water; and
    (e) said cold water being circulated to a water-to-air heat exchanger for cooling said data center equipment.

* * * * *